United States Patent [19]

Oppelt

[11] Patent Number: 4,652,824
[45] Date of Patent: Mar. 24, 1987

[54] SYSTEM FOR GENERATING IMAGES AND SPACIALLY RESOLVED SPECTRA OF AN EXAMINATION SUBJECT WITH NUCLEAR MAGNETIC RESONANCE

[75] Inventor: Arnulf Oppelt, Erlangen, Fed. Rep. of Germany

[73] Assignee: Siemens Aktiengesellschaft, Berlin and Munich, Fed. Rep. of Germany

[21] Appl. No.: 586,049

[22] Filed: Mar. 5, 1984

[30] Foreign Application Priority Data

Mar. 21, 1983 [DE] Fed. Rep. of Germany ....... 3310160

[51] Int. Cl.⁴ .................... G01R 33/20; H01F 7/22; F17C 1/00
[52] U.S. Cl. .................................. 324/318; 324/319; 335/216; 62/514 R
[58] Field of Search ............... 324/309, 315, 318, 319, 324/320, 322; 335/296, 300, 301, 316, 216, 299; 62/514 R

[56] References Cited

U.S. PATENT DOCUMENTS

| | | | |
|---|---|---|---|
| 3,173,079 | 3/1965 | McFee | 335/216 |
| 3,336,526 | 8/1967 | Weaver, Jr. et al. | 324/319 |
| 4,291,541 | 9/1981 | Kneip, Jr. et al. | 62/514 R X |
| 4,315,216 | 2/1982 | Clow | 324/309 |
| 4,442,404 | 4/1984 | Bergmann | 324/309 |
| 4,467,303 | 8/1984 | Laskaris | 335/216 |
| 4,520,315 | 5/1985 | Loeffler | 324/309 |

OTHER PUBLICATIONS

Kaufman et al., Hardware for NMR Imaging, Nuclear Magnetic Resonance Imaging in Medicine, 1981, pp. 53–63.
Conference: Proceedings of the 10th International Conference on Low Temperature Physics Otenaimi, Finland (Aug. 14–20, 1975), pp. 286–288 by J. D. Wilde.
Kaufman, Nuclear Magnetic Resonance Imaging in Medicine, 1981, pp. 53–63.

*Primary Examiner*—Stewart J. Levy
*Assistant Examiner*—Scott M. Oldham

[57] ABSTRACT

For providing nuclear magnetic resonance equipment with reduced noise generation, gradient coils are disposed in the vacuum of the cryostat which accepts the superconducting magnetic coils for generating the fundamental field. Under given conditions, the radio-frequency transmission and reception coils or antennae are also located in the vacuum.

5 Claims, 4 Drawing Figures ly, has shim coils to be used as needed, which are not illustrated in FIG. 4.

SYSTEM FOR GENERATING IMAGES AND SPACIALLY RESOLVED SPECTRA OF AN EXAMINATION SUBJECT WITH NUCLEAR MAGNETIC RESONANCE

BACKGROUND OF THE INVENTION

The invention relates to a system for generating images and spacially resolved spectra of an examination subject with nuclear magnetic resonance wherein electromagnetic coils are provided for the application of fundamental and gradient fields to the examination subject and for the acquisition of the excursion of the atomic nucleii of the examination subject from their position of equilibrium due to a high-frequency magnetic exciting pulse and wherein an image reconstruction means generates an image or, respectively, spacially resolved nuclear magnetic resonance spectra for a predetermined measuring region, such system utilizing a cryostat for containing predominantly superconducting fundamental field coils, said cryostat having a vacuum chamber.

Given known devices of this type, the connection and disconnection of the current in the gradient coils leads to the development of noise which can be bothersome to the patient surrounded by these coils. The reason for the development of this noise is that a force impulse acts on the electrical conductors during connection and disconnection of the gradient current given the presence of the constant magnetic field; such force impulse induces vibration in the carrier tube of the gradient coils present in the known devices. This force impulse producing the vibration is all the greater the shorter the connect/disconnect time of the gradient current, the higher the gradient current and the higher the fundamental field. Demands in this direction are raised, however, for the purpose of producing qualitatively high-grade NMR tomograms.

SUMMARY OF THE INVENTION

The object of the invention is to improve upon a device of the type initially cited such that the development of noise due to power surges influencing the electrical conductors of the coils is significantly reduced in comparison to the prior art.

The object is inventively achieved in that, given utilization of fundamental field magnets having super conducting coils that are cooled with liquid helium and are situated in a cryostat with a vacuum envelope for the purpose of thermal insulation, the gradient coils are disposed three-dimensionally insulated (spatially isolated) in this vacuum envelope.

The large-surface-area emission of sound is prevented by means of as three-dimensionally insulated as possible a disposition of the gradient coils. The transmission of structure-borne noise to the cryostat can be kept low by means of suspensions having sufficient self-damping.

According to a further development of the invention, the disposition of the gradient coils in the vacuum envelope of the cryostat can be combined with the disposition of the radio-frequency transmission and reception coils in this selfsame envelope. In this case, the patient opening remains entirely unimpeded (free). Evaporating coolant (helium or nitrogen) can be employed for cooling the gradient coils and the radio-frequency coil system, whereby the thermal noise is reduced.

The invention is explained in greater detail below with reference to two exemplary embodiments illustrated in FIGS. 1 and 2 on the accompanying drawing sheet; and other objects, features and advantages will be apparent from this detailed disclosure and from the appended claims.

DETAILED DESCRIPTION

Figure 1:
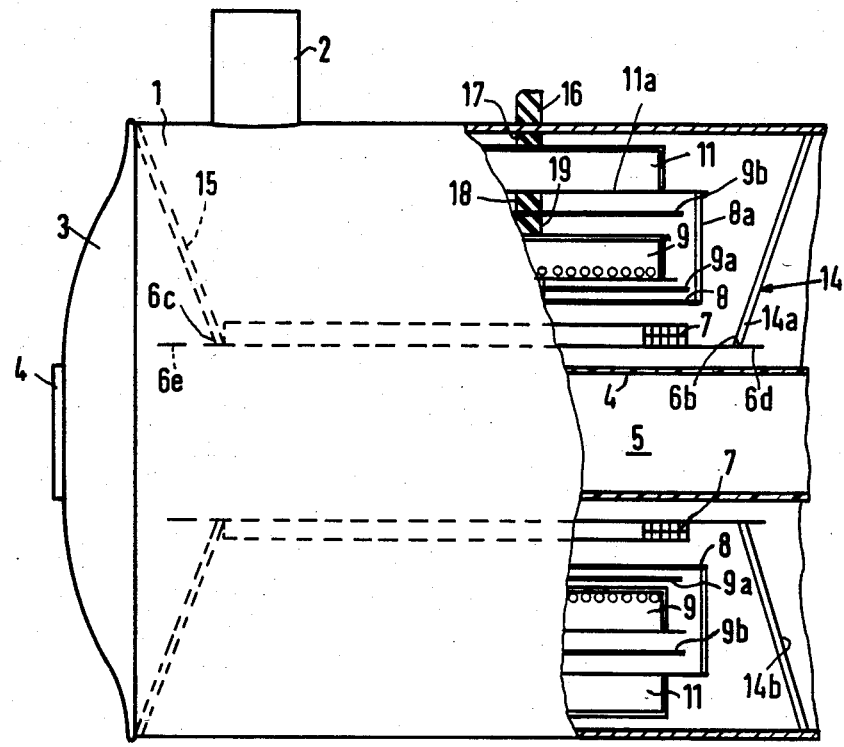
FIG. 1 is a somewhat diagrammatic partial elevational view of a cryostat, with the wall broken away to indicate the components contained therein.

In FIG. 1, a cryostat for a superconducting magnet is schematically illustrated, augmented by the gradient coils 7. Reference numeral 1 designates a vacuum housing and 2 designates a tower which receives feed lines for the conduction of liquid coolant media and the supply of electric power. The housing 1 is provided with a cover 3 that carries a pipe 4 of synthetic material at its center separating the patient receiving space 5 from the vacuum. In the drawing, the cryostat wall is shown partly broken away so that the internal parts may be seen. Reference numeral 6 represents an introduced support pipe of synthetic material with the gradient coils 7 supported thereon; 8 represents a cooling shield that is connected thermally conductive to the nitrogen tank 11; 9a and 9b represent further cooling shields that reduce thermal radiation onto the helium tank 9. The fundamental field coils are situated in the helium tank 9. The development of noise due to energization and deenergization of the gradient coils 7 is significantly reduced over the prior art due to the disposition of the gradient coils 7 in the vacuum between the housing 1 and the synthetic pipe 4.

Figure 2:
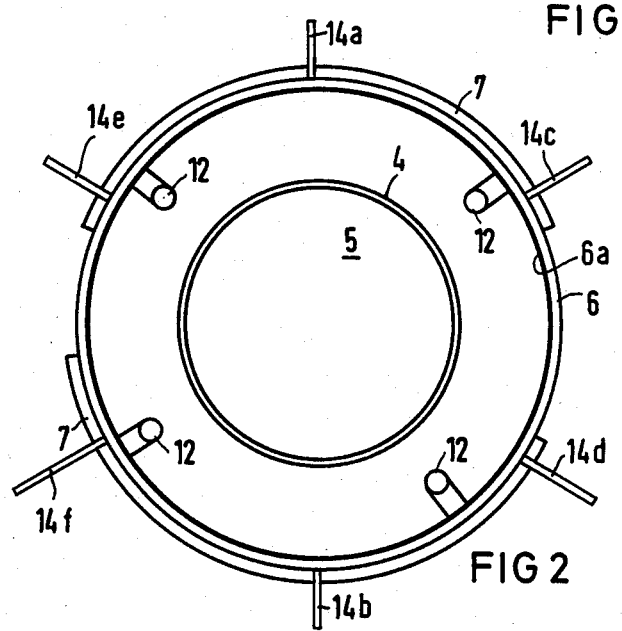
FIG. 2 is a partial cross sectional view showing the components which are located nearest the central axis of the apparatus of FIG. 1.

Given the exemplary embodiment shown in cross-section in FIG. 2, the cryostat is augmented by a radio-frequency transmission and reception system, preferably according to U.S. Pat. No. 4,520,315. To this end, rods 12 that form the radio-frequency transmission and reception antennae are mounted at the inside of the support pipe 6 for the gradient coils 7. Given the exemplary embodiment according to FIG. 2, the support pipe 6 is coated on the inside at 6a with a conductive copper or silver layer for shielding purposes. Alternatively, however, conventional radio-frequency coils, preferably saddle coils, can also be employed.

Figure 4:
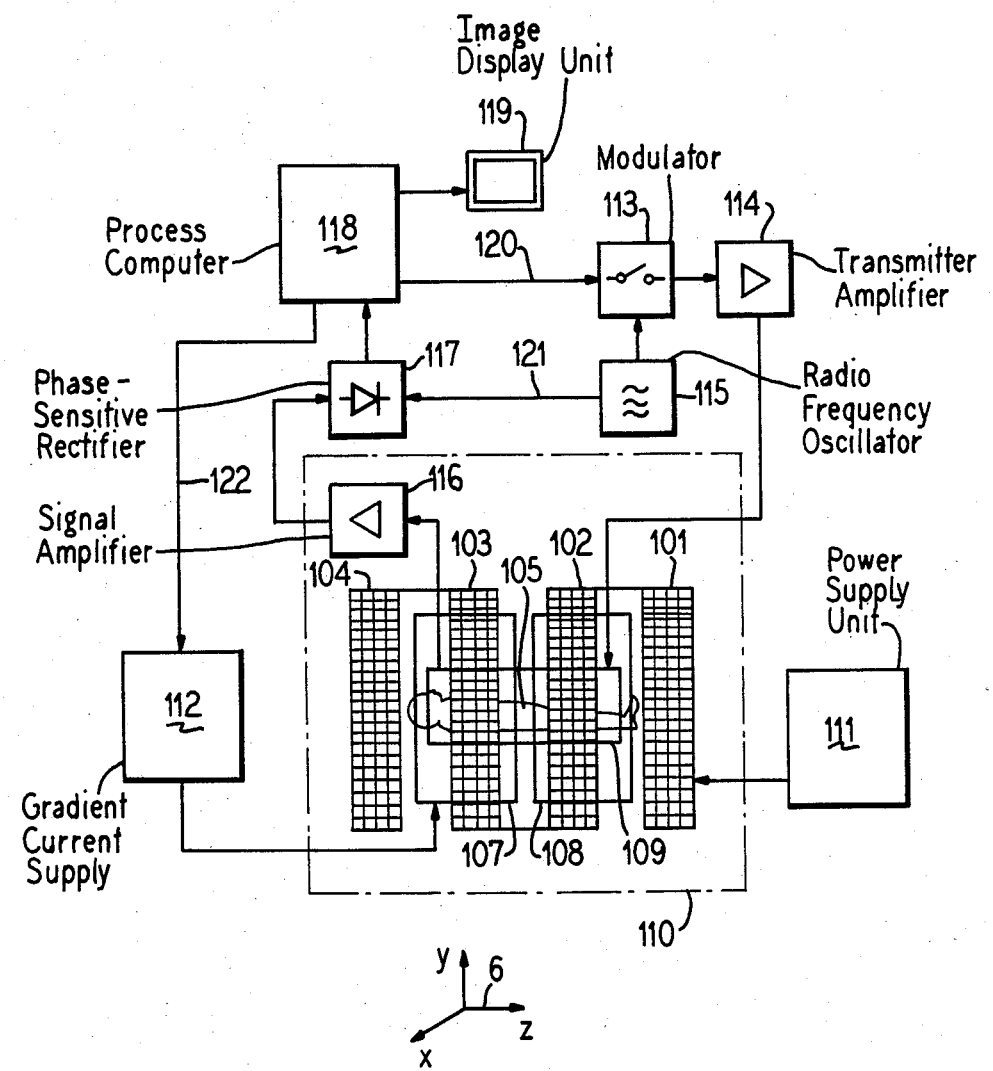
FIG. 4 illustrates the complete equipment.

In FIG. 4, 101 and 102 as well as 103 and 104, characterize coils with which a DC magnetic field $B_0$ is generated in which, in the case of application for medical diagnostics, the body 105 to be examined of a patient is disposed. Moreover, gradient coils are associated with said patient which are provided for the purpose of generating independent, mutually perpendicular magnetic field gradients of the directions x, y, and z, according to the directions indicated at 106 in FIG. 4. In the Figure, for the purpose of clarity, only coils 107 and 108 are illustrated which, together with a pair of opposite similar coils, serve the purpose of generating an x-gradient. The similar, not-illustrated y-gradient coils are disposed parallel to the body 105 and above as well as below said body and those for the z-gradient field are disposed transversely to the longitudinal axis at the head end and at the foot end. The arrangement, moreover, additionally contains a high frequency coil 109 serving the purpose of excitation of the nuclear resonance and reception of the nuclear resonance signals.

The coils 101 through 104, 107, 108 and 109, bordered by a dash-dot line 100, represent the actual examination instrument. It is operated from an electric arrangement which comprises a power supply unit 111 for the operation of the magnetic coils 101 through 104 as well as a gradient current supply 112 to which the coils 107 and 108, as well as the additional gradient coils, are connected. The coil 109 serving the purpose of excitation as well as reception of the signal, is connected, via a modulator 113 and a transmitter amplifier 114, to a radio-frequency oscillator 115, on the one hand, and, via a signal amplifier 116 and a phase-sensitive rectifier 117, to a process computer 118, on the other hand, from which, for the purpose of output of the image information, a viewing screen apparatus 119 is supplied. For controlling the arrangement, moreover, additionally connections 120, 121, and 122 are provided between the computer 118 and the modulator 113, between the oscillator 115 and the rectifier 117, as well as between the computer 118 and the gradient current supply 112.

It will be apparent that many modifications and variations may be made without departing from the scope of the teachings and concepts of the present invention.

SUPPLEMENTARY DISCUSSION

Background concerning the operation of nuclear magnetic resonance equipment is found in an article by Zeitler et al "Nuclear Magnetic Resonance Tomography (NMR Tomography) and Its Clinical Application Possibilities", Electromedica (English Edition) No. 3/1981, pages 134–143, and in an article by Loeffler and Oppelt "Possibilities and Limitations of NMR Imaging", Electromedica (English Edition), No. 2, 1982, pages 38–40. Incorporated herein by reference is the disclosures of the following U.S. patent:

(1) U.S. Pat. No. 4,520,315 filed Sept. 1, 1982 which issued May 28, 1985 entitled "Nuclear Spin Tomography Method" in the names of Loeffler, Oppelt and Siebold.

The process computer for image reconstruction, the radio frequency transmission and reception means may be as shown and described in U.S. Pat. No. 4,520,315.

The fundamental magnetic field coil produces a fundamental initially homogeneous magnetic field $B_o$. In the embodiment of FIG. 1 herein, the fundamental field coil 101 is located in an annular chamber 9 which surrounds the longitudinal axis of the cylindric cryrostat housing 1. The fundamental field is thus parallel to the longitudinal axis of the cylindrical patient receiving space 5 and has an essentially uniform field intensity over the measurement region of the patient receiving space. An RF coil may be used for applying a radio frequency magnetic field pulse at right angles to the fundamental field $B_o$. Such an RF coil, or the RF antennae 12, FIG. 2 may be located within the cylindrical shielding layer 6a, FIG. 2 of cylindrical support tube 6, and may be in the annular vacuum space between cylindrical pipe or tube 4 and the cylindrical support tube 6 in the illustrated embodiments of the present disclosure.

The radio frequency means in the form of an RF coil or in the form of RF antenna elements 12, FIG. 2, thus may be located in the vacuum space within cryostat housing 1 and may be cooled by either evaporating helium or evaporating nitrogen in order to reduce their thermal noise.

The gradient fields parallel to the fundamental field $B_o$ in the direction of the z-axis and in the orthogonally related directions of the x-axis and y-axis are illustrated diagrammatically in FIG. 1 of U.S. Pat. No. 4,520,315.

By way of example, the cylindrical housing 1 may have opposite end covers such as 4 supporting opposite ends of the nonmagnetic cylindrical tube or pipe 4 which opens to ambient atmosphere at each of the opposite ends so that the patient can enter space 5 from either end. The measuring region may comprise a sphere having a diameter of 30 centimeters, for example, located centrally within the patient receiving space 5.

By way of diagrammatic illustration, the support pipe 6 may be of sufficiently rigid nonmagnetic material so as to be supported at its opposite ends as indicated at 14 and 15 in FIG. 1. The suspension cables such as indicated specifically at 14a and 14b in FIG. 1, and at 14a–14f in FIG. 2, may have suitable vibration damping means associated therewith. The inner ends of the suspension means 14 and 15 may be secured to tube 6 at locations such as indicated at 6b and 6c. Any reinforcement at locations such as 6b and 6c would be completely isolated in the vacuum space of the cryostat housing 1 and free of engagement with solid parts. In this example, support legs for the housing 1 may support external ribs such as indicated at 16 completely encircling the housing 1 as shown in the third figure of the Zeitler et al article, and internal annular spacer rings such as 17, 18, and 19, FIG. 1 may be radially aligned with the external ribs at the inner side of the housing 1 so as to support the tank 11, shield 9b, tank 9 and shields 9a and 8 from the ribs through the thickness of wall 1 (in compression) at the lower half of the cryostat. All such spacer rings are of non-magnetic material of good thermal insulating properties.

Shield 8, however, may have radially extending collars such as 8a, FIG. 1, of thermally conductive material at each end thereof so as to provide a thermally conductive connection with the inner wall 11a of the nitrogen tank 11.

With the exemplary support tube 6, each free end 6d and 6e of the tube 6 terminates in spaced relation to all solid structure including the covers such as 3, so that the tube 6 is completely surrounded and isolated by vacuum space except for the suspension means 14, 15. Any vibration components introduced into the output electric signal may be electrically removed by filtering, for example.

Figure 3:
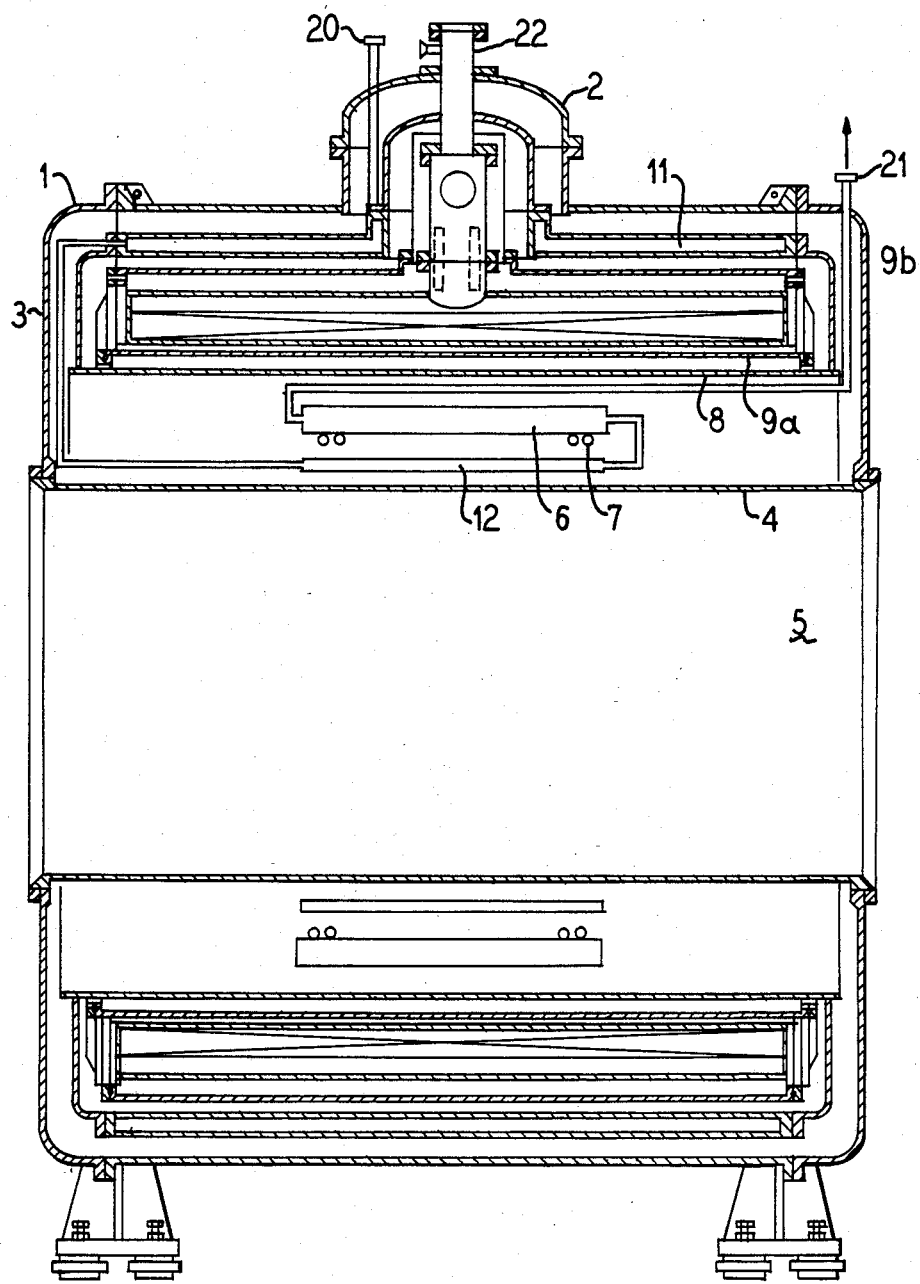
FIG. 3 is a sectional view of the cryostat.

FIG. 3 illustrates the pipe 20 for filling the nitrogen tank 11. The pipe 21 is for evaporating nitrogen and the tube 22 is for filling the helium tank 9 and for evaporating the helium. The gradient coils 7 and the radio frequency coils are illustrated.

I claim as my invention:

1. A cryostat for use in a system for generating images and/or spacially resolved spectra of an examination subject with nuclear magnetic resonance, said system having electromagnetic means comprising fundamental field coils and gradient coils for the application of fundamental and gradient fields to the examination subject, radio-frequency transmission means for producing radio-frequency magnetic exciting pulses resulting in an excursion of the atomic nuclei of the examination subject from their position of equilibrium, radio frequency reception means for sensing the signals caused by this excursion, image reconstruction means connected to the gradient coils and the radio-frequency transmission and radio frequency reception means for producing an image of a predetermined measuring region, whereby the fundamental coils, the gradient coils and the radio-frequency transmission and radio frequency reception means are placed in the cryostat and the image reconstruction means are placed outside of the cryostat, said cryostat having a vacuum chamber and the gradient coils for producing a gradient field being disposed three-dimensionally isolated in said vacuum chamber.

2. A system as claimed in claim 1 wherein said radio-frequency transmission and said radio frequency reception means are also disposed in the vacuum chamber.

3. A system as claimed in claim 1 wherein the gradient coils are cooled by evaporating helium that serves for cooling the superconducting fundamental field coils, said gradient coils being cooled thereby in order to keep the thermal load low.

4. A system as claimed in claim 1 wherein the gradient coils are cooled by evaporating liquid nitrogen that serves for cooling radiation shields in the cryostat, being cooled thereby in order to keep the thermal load low.

5. A system as claimed in claim 2 wherein the radio-frequency means are cooled by either evaporating helium or nitrogen in order to reduce their thermal noise.

* * * * *